United States Patent
Li

(10) Patent No.: US 11,112,918 B2
(45) Date of Patent: Sep. 7, 2021

(54) TOUCH DISPLAY DEVICE HAVING FINGERPRINT RECOGNITION FUNCTION

(71) Applicant: Wuhan China Star Optoelectronics Semiconductor Display Technology Co., Ltd., Wuhan (CN)

(72) Inventor: Yuanhang Li, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 69 days.

(21) Appl. No.: 16/624,919

(22) PCT Filed: Jul. 25, 2019

(86) PCT No.: PCT/CN2019/097716
§ 371 (c)(1),
(2) Date: Dec. 20, 2019

(87) PCT Pub. No.: WO2021/012267
PCT Pub. Date: Jan. 28, 2021

(65) Prior Publication Data
US 2021/0208734 A1 Jul. 8, 2021

(30) Foreign Application Priority Data
Jul. 19, 2019 (CN) .......................... 201910657298.6

(51) Int. Cl.
*G06F 3/044* (2006.01)
*G06K 9/00* (2006.01)
*H01L 27/32* (2006.01)
*H01L 51/00* (2006.01)

(52) U.S. Cl.
CPC .......... *G06F 3/0445* (2019.05); *G06K 9/0002* (2013.01); *H01L 27/323* (2013.01); *H01L 51/0097* (2013.01)

(58) Field of Classification Search
CPC ... G06F 3/0445; G06K 9/0002; H01L 27/323; H01L 51/0097
See application file for complete search history.

(56) References Cited

U.S. PATENT DOCUMENTS

| | | | |
|---|---|---|---|
| 2012/0105081 A1* | 5/2012 | Shaikh ................. | G06K 9/0002 324/686 |
| 2016/0350570 A1* | 12/2016 | Han ..................... | G06F 3/04164 |
| 2018/0349719 A1* | 12/2018 | Lius .................... | G02F 1/133514 |
| 2020/0327294 A1* | 10/2020 | Cheng ................... | G06F 3/0446 |

* cited by examiner

*Primary Examiner* — Stephen G Sherman

(57) ABSTRACT

A touch display device includes a display panel and a touch recognition module. The touch recognition module includes a first electrode layer disposed on the display panel, an insulating layer disposed on both the first electrode layer and the display panel, and a second electrode layer disposed on the insulating layer. The first electrode layer includes a plurality of first touch electrodes spaced apart from each other, and the second electrode layer includes a touch area and a fingerprint recognition area adjacent to the touch area.

8 Claims, 5 Drawing Sheets

TOUCH DISPLAY DEVICE HAVING FINGERPRINT RECOGNITION FUNCTION

RELATED APPLICATIONS

This application is a National Phase of PCT Patent Application No. PCT/CN2019/097716 having International filing date of Jul. 25, 2019, which claims the benefit of priority of Chinese Patent Application No. 201910657298.6 filed on Jul. 19, 2019. The contents of the above applications are all incorporated by reference as if fully set forth herein in their entirety.

FIELD AND BACKGROUND OF THE INVENTION

The present invention relates to a technical field of displays, and particularly to, a touch display device.

With development of display technology, due to advantages of having high image quality, being power saving, thin body, and a wide range of applications, flat panel display devices are thus widely used in various consumer electronic products, such as mobile phones, televisions, personal digital assistants, digital cameras, notebook computers, and desktop computers, and have become the mainstream of displays.

Organic light-emitting diodes (OLEDs) are regarded as an emerging application technology of next generation flat panel displays because of their outstanding characteristics of being self-luminous, operating without backlights, high contrast, thin thickness, wide viewing angles, quick response times, adaptability to bendable panels, wide temperature ranges, and having simple structure and manufacturing processes.

OLED display devices generally include substrates, anodes disposed on the substrates, hole injection layers disposed on the anodes, hole transport layers disposed on the hole injection layers, light-emitting layers disposed on the hole transport layers, electron transport layers disposed on the light-emitting layers, electron injection layers disposed on the electron transport layers, and cathodes on the electron injection layers. A principle of luminescence of OLED display devices is that semiconductor materials and organic luminescent materials are driven by electric field, causing luminescence by carrier injection and recombination. Specifically, OLED display devices generally use indium tin oxide (ITO) pixel electrodes and metal electrodes as anodes and cathodes of the devices, respectively. Electrons and holes are injected from the cathodes and the anodes to the electron transport layers and the hole transport layers, respectively, driven by a certain voltage. The electrons and holes migrate to the light-emitting layers through the electron transport layers and the hole transport layers, respectively, and meet in the light-emitting layers to form excitons and excite light-emitting molecules, and the latter emits visible light through radiation relaxation.

As one of biometric recognition technologies, fingerprint recognition technology has characteristics of being universal, unique, secure, and collectable, and has been widely used in products such as smart phones. With rise of full-screen technology, fingerprint recognition has gradually developed from outside of displays to inside of the displays, and is known as fingerprint recognition technology under screens, to pursue a higher screen ratio. However, current fingerprint recognition is mostly implemented by a plug-in structure, even if on-screen fingerprint recognition modules are still used in on-screen display panels. Such a method will increase thickness of screens and finished products, complicate fabrication processes, increase manufacturing costs, and adversely affect user experience.

SUMMARY OF THE INVENTION

An object of the present invention is to provide a touch display device, capable of effectively reducing thickness of the device and lowering manufacturing costs, thereby to fulfill integration of fingerprint recognition under a screen and touch control and improve user experience.

To achieve the above-mentioned object, the present invention provides a touch display device, comprising a display panel and a touch recognition module; wherein the touch recognition module comprises a first electrode layer disposed on the display panel, an insulating layer disposed on both the first electrode layer and the display panel, and a second electrode layer disposed on the insulating layer; wherein the first electrode layer comprises a plurality of first touch electrodes spaced apart from each other, and the second electrode layer comprises a touch area and a fingerprint recognition area adjacent to the touch area, wherein the touch area comprises a plurality of second touch electrodes spaced apart from each other, and the fingerprint recognition area comprises a plurality of fingerprint recognition electrodes arranged in an array; and wherein during touch sensing, the first touch electrodes, the second touch electrodes, and the fingerprint recognition electrodes cooperatively form mutual capacitance for touch detection, and during fingerprint recognition, the fingerprint recognition electrodes form self-capacitance for recognizing a fingerprint.

The touch display device further comprises a driver module, wherein the first touch electrodes, the second touch electrodes, and the fingerprint recognition electrodes are all electrically connected to the driver module; wherein the driver module is configured to provide a touch driving pulse to the second touch electrodes and the fingerprint recognition electrodes during touch sensing, so that the first touch electrodes are charged by the touch driving pulse, and when recognizing a fingerprint, controlling the first touch electrodes and the second touch electrodes to be grounded, and providing a fingerprint recognition pulse to the fingerprint recognition electrodes.

The first touch electrodes in an extending direction are perpendicular to the second touch electrodes in an extending direction.

The touch area is concave in shape, and the fingerprint recognition area is defined by a concave portion of the touch area; wherein the touch area comprises a first sub-area and a second sub-area both disposed on left and right sides of the fingerprint recognition electrodes, respectively; and wherein the second electrode layer further comprises a plurality of connecting lines, one end of each of the connecting lines is electrically connected to one of the second touch electrodes in the first sub-area, and the other end bypasses the fingerprint recognition area to be electrically connected to one of the second touch electrodes in the second sub-area, wherein two of the second touch electrodes connected by the same connecting line are on a same straight line.

The first electrode layer further comprises a first touch connecting line, and the first touch electrodes are electrically connected to the driver module through the first touch connecting line, and wherein the second electrode layer further comprises a second touch connecting line and a plurality of fingerprint connecting lines, and the second touch electrodes are electrically connected to the driver module through the second touch connecting line, wherein each of the fingerprint recognition electrodes is electrically connected to the driver module through one of the fingerprint connecting lines.

The display panel and the driver module are arranged sequentially in an extension direction of the first touch electrodes; wherein one end of the first touch connecting line is electrically connected to one end of each of the first touch electrodes away from the driver module, and the other end of the first touch connecting line is electrically connected to the driver module through a side of the display panel; and one end of the second touch connecting line is connected to one end of each of the second touch electrodes at another side of the display panel, and the other end of the second touch connecting line is electrically connected to the driver module.

The first touch connecting line is electrically connected to the driving module after being changed to the second electrode layer through a via hole extending through the insulating layer.

The fingerprint connecting lines are each a metal mesh line or a transparent metal line.

The display panel is an organic light-emitting diode (OLED) display panel.

The display panel comprises a flexible substrate, a thin-film transistor (TFT) array disposed on the flexible substrate, an OLED layer disposed on the TFT array, and a thin-film encapsulation layer disposed on the OLED layer.

The present invention has advantageous effects as follows: the present invention provides a touch display device including a display panel and a touch recognition module. The touch recognition module includes a first electrode layer disposed on the display panel, an insulating layer disposed on both the first electrode layer and the display panel, and a second electrode layer disposed on the insulating layer. The first electrode layer includes a plurality of first touch electrodes spaced apart from each other, and the second electrode layer includes a touch area and a fingerprint recognition area adjacent to the touch area. The touch area includes a plurality of second touch electrodes spaced apart from each other, and the fingerprint recognition area includes a plurality of fingerprint recognition electrodes arranged in an array. During touch sensing, the first touch electrodes, the second touch electrodes, and the fingerprint recognition electrodes cooperatively form mutual capacitance for touch detection. During fingerprint recognition, the fingerprint recognition electrodes form self-capacitance for recognizing a fingerprint. In this manner, the present invention can reduce thickness of the device and lower manufacturing costs, thereby to fulfill integration of fingerprint recognition under a screen and touch control and improve user experience.

BRIEF DESCRIPTION OF THE SEVERAL VIEWS OF THE DRAWINGS

In order to further understand the features and technical contents of the present invention, please refer to the following detailed description of the invention and the accompanying drawings. The drawings, however, are for the purpose of illustration and description, and are not intended to limit the present invention.

DESCRIPTION OF SPECIFIC EMBODIMENTS OF THE INVENTION

In order to further clarify the technical means and effects of the present invention, the following detailed description will be made in conjunction with the preferred embodiments of the invention and the accompanying drawings.

Figure 1:
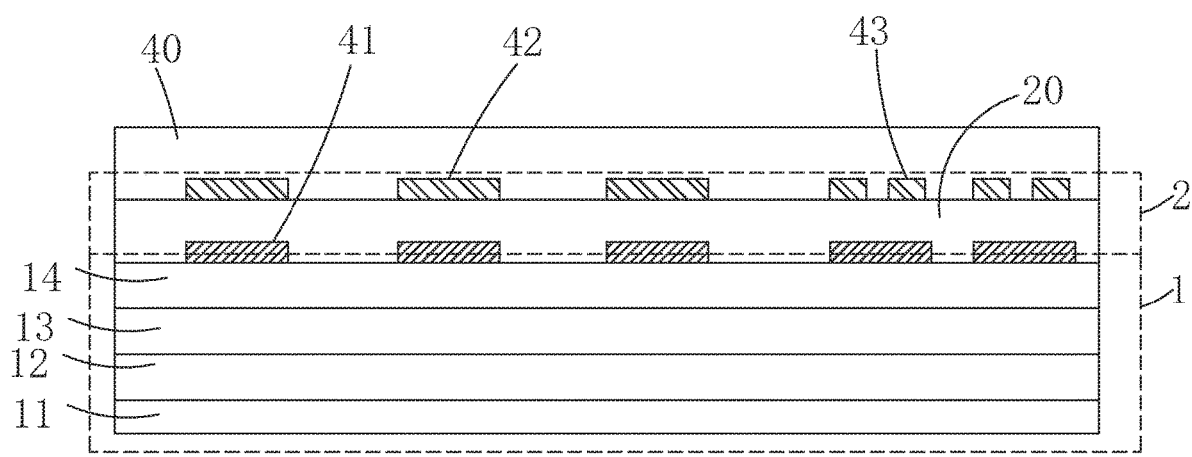
FIG. 1 is a cross-sectional view of a touch display device of the present invention.
Figure 2:
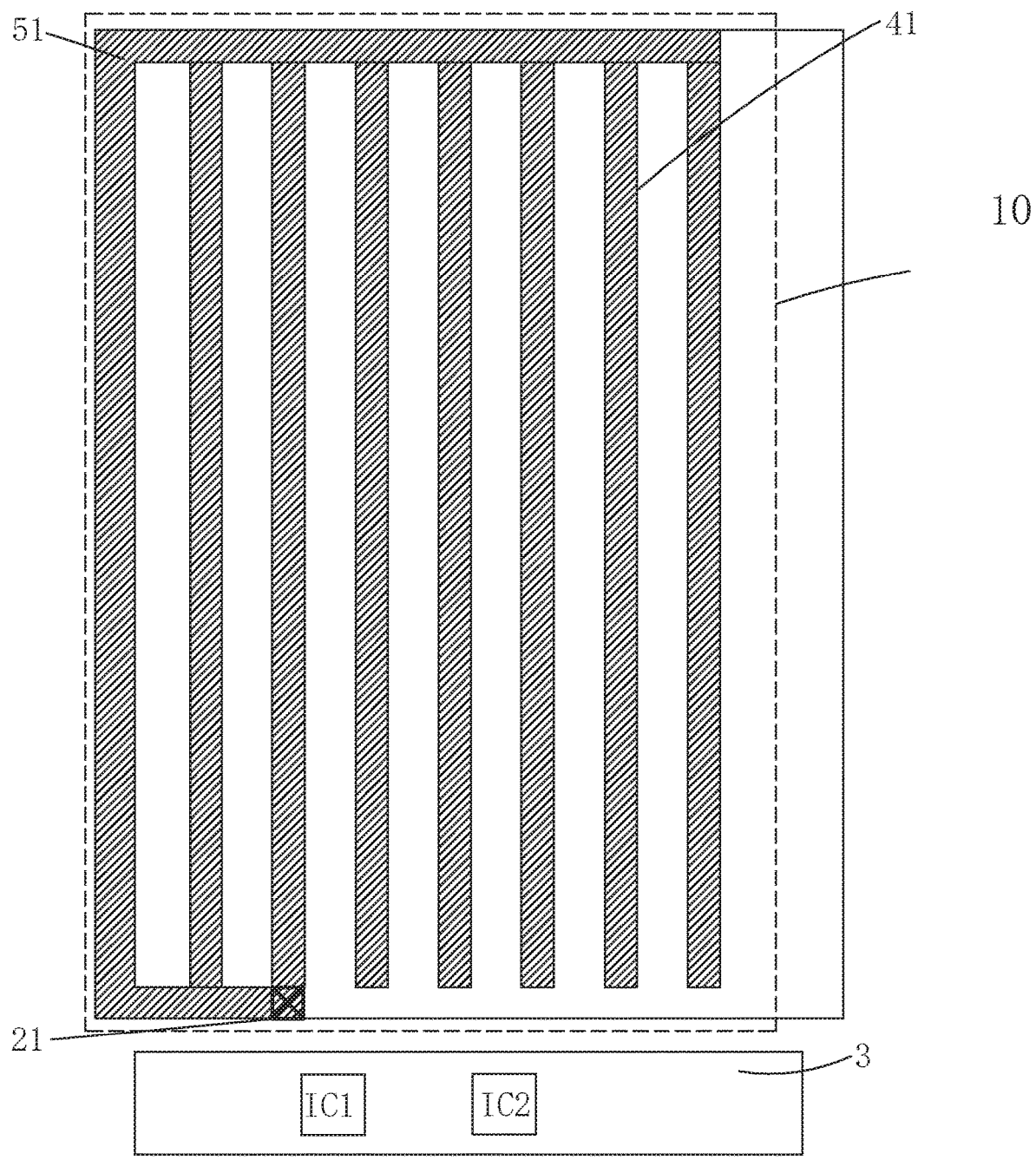
FIG. 2 is a schematic view of a first electrode layer of a touch display device of the present invention.
Figure 3:
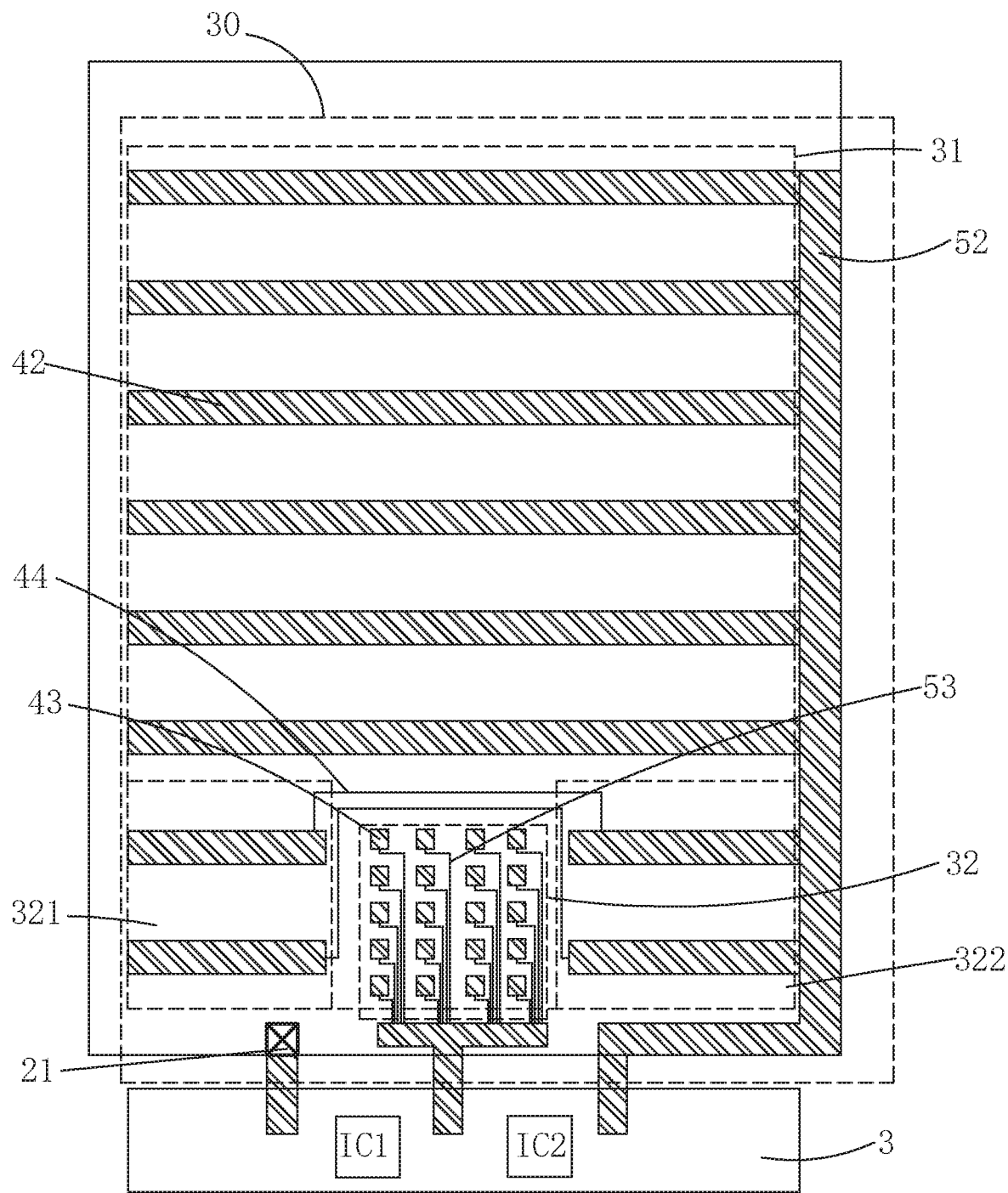
FIG. 3 is a schematic view of a second electrode layer of a touch display device of the present invention.

Please refer to FIGS. 1 to 3. The present invention provides a touch display device including a display panel 1 and a touch recognition module 2.

The touch recognition module 2 includes a first electrode layer 10 disposed on the display panel 1, an insulating layer 20 disposed on both the first electrode layer 10 and the display panel 1, and a second electrode layer 30 disposed on the insulating layer 20.

The first electrode layer 10 includes a plurality of first touch electrodes 41 spaced apart from each other. The second electrode layer 30 includes a touch area 31 and a fingerprint recognition area 32 adjacent to the touch area 31, wherein the touch area 31 includes a plurality of second touch electrodes 42 spaced apart from each other, and the fingerprint recognition area 32 includes a plurality of fingerprint recognition electrodes 43 arranged in an array.

During touch sensing, the first touch electrodes 41, the second touch electrodes 42, and the fingerprint recognition electrodes 43 cooperatively form mutual capacitance for touch detection.

During fingerprint recognition, the fingerprint recognition electrodes form self-capacitance for recognizing a fingerprint.

In addition, the touch display device further includes a driver module 3. The first touch electrodes 41, the second touch electrodes 42, and the fingerprint recognition electrodes 43 are all electrically connected to the driver module 3.

The driver module 3 is configured to provide a touch driving pulse to the second touch electrodes 42 and the fingerprint recognition electrodes 43 during touch sensing, so that the first touch electrodes 41 are charged by the touch driving pulse. When recognizing a fingerprint, controlling the first touch electrodes 41 and the second touch electrodes 42 to be grounded, and providing a fingerprint recognition pulse to the fingerprint recognition electrodes 43.

Specifically, the first touch electrodes 41 in an extending direction are perpendicular to the second touch electrodes 42 in an extending direction.

Specifically, the touch area 31 is concave in shape, and the fingerprint recognition area 32 is defined by a concave portion of the touch area 31.

The touch area 31 includes a first sub-area 321 and a second sub-area 322 both disposed on left and right sides of the fingerprint recognition electrodes 43, respectively.

The second electrode layer 30 further includes a plurality of connecting lines 44, one end of each of the connecting lines 44 is electrically connected to one of the second touch electrodes 42 in the first sub-area 321, and the other end bypasses the fingerprint recognition area 32 to electrically connect to one of the second touch electrodes 42 in the second sub-area 322, wherein two of the second touch electrodes 42 connected by the same connecting line 44 are on a same straight line. The second touch electrode 42 cut away by the second sub-area 322 can be re-connected together.

Specifically, as shown in FIGS. 2 and 3, in order to achieve electrical connection among the first touch electrodes 41, the second touch electrodes 42, the fingerprint recognition electrodes 43, and the driving module 3, the first electrode layer 10 of the present invention further includes a first touch connecting line 51, and the second electrode layer 30 further includes a second touch connecting line 52 and a plurality of fingerprint connecting lines 53. The first touch connecting line 51 is configured to connect the first touch electrodes 41 to the driver module 3. The second touch connecting line 52 is configured to connect the second touch electrodes 42 to the driver module 3. The fingerprint connecting lines 53 are configured to connect each of the fingerprint recognition electrodes 43 to the driver module 3.

Specifically, the first touch electrodes 41 are electrically connected to the driver module 3 through the first touch connecting line 51. The second touch electrodes 42 are electrically connected to the driver module 3 through the second touch connecting line 52. Each of the fingerprint recognition electrodes 43 is electrically connected to the driver module 3 through one of the fingerprint connecting lines 53.

Further, in certain embodiments of the present invention, the display panel 1 and the driver module 3 are arranged sequentially in an extension direction of the first touch electrodes 41. One end of the first touch connecting line 51 is electrically connected to one end of each of the first touch electrodes 41 away from the driver module 3, and the other end of the first touch connecting line 51 is electrically connected to the driver module 3 through a side of the display panel 1. Moreover, as shown in FIGS. 2 and 3, the first touch connecting line 51 is electrically connected to the driving module 3 after being changed to the second electrode layer 30 through a via hole 21 extending through the insulating layer 20. One end of the second touch connecting line 52 is connected to one end of each of the second touch electrodes 42 at another side of the display panel 1, and the other end of the second touch connecting line 52 is electrically connected to the driver module 3.

In the embodiment as shown in FIGS. 2 and 3, one end of the first touch connecting line 51 is electrically connected to an upper end of each of the first touch electrodes 41, and the other end bypasses the display panel 1 from a left side of the display panel 1 to connect to a lower end of the driver module 3. One end of the second touch connecting line 52 is connected to a right end of each of the second touch electrodes 42, the other end of the second touch connecting line 52 extends to the lower end of the display panel 1 to connect to the driver module 3, thereby to avoid interference in the first touch connecting line 51, the second touch connecting line 52, and the fingerprint connecting lines 53.

Figure 5:
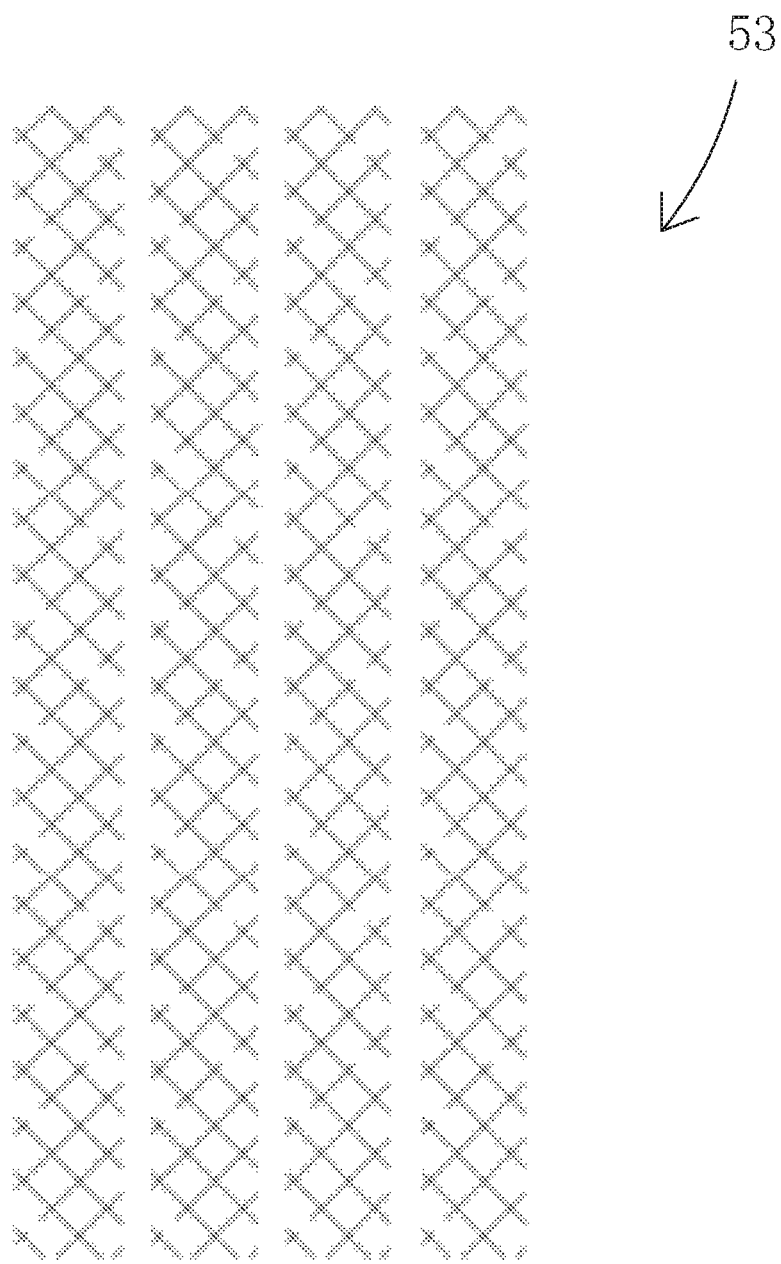
FIG. 5 is a schematic view showing fingerprint traces of a touch display device of the present invention.

Specifically, the fingerprint connecting lines 53 are each a metal mesh line or a transparent metal line to expose a light-emitting area of the display area 1. When the fingerprint connecting lines 53 are metal mesh lines, as shown in FIG. 5, each of the metal mesh lines has a width of 2 to 3 grid cells to reduce impedance, wherein multiple fractures of 3-5 micros (μm) width are designed according to optical simulation to provide optical compensation.

Specifically, the display panel 1 is an organic light-emitting diode (OLED) display panel. As shown in FIG. 1, the display panel 1 includes a flexible substrate 11, a thin-film transistor (TFT) array 12 disposed on the flexible substrate 11, an OLED layer 13 disposed on the TFT array 12, and a thin-film encapsulation layer 14 disposed on the OLED layer 13.

Specifically, the first touch electrodes 41, the second touch electrodes 42, the fingerprint recognition electrodes 43, the first touch connecting line 51, and the second touch connecting line 52 are made of metal, or specifically, titanium, gold, silver, copper, lithium, sodium, potassium, magnesium, aluminum, zinc, and combinations thereof. Alternatively, conductive metal oxides such as indium tin oxide, aluminum-doped zinc oxide, antimony-doped tin oxide, and combinations thereof may also be used. The insulating layer 20 is made of an organic insulating material or an inorganic insulating material, such as silicon nitride, silicon oxide, or organic photoresist.

Specifically, the touch recognition module 2 is fabricated by a low temperature process of less than 90° C. to prevent performance of the OLED display panel from being affected. Furthermore, by arranging the second touch electrodes 42 and the fingerprint recognition electrodes 43 in a same layer, a product structure can be simplified, a product can be made thinner, and number of masks for fabrication processes as well as production costs can be reduced.

Specifically, the driver module 3 is a flexible printed circuit (FPC), and is provided with a touch chip (IC1) for touch detection and a fingerprint recognition chip (IC2) for fingerprint recognition. The flexible circuit board is configured with three bonding pads for bonding the first touch connecting line 51, the second touch connecting line 52, and the fingerprint connecting lines 53, respectively.

Specifically, each of the first touch electrodes 41 and the second touch electrodes 42 has a size about 4 millimeters (mm) and is diamond or strip shaped. Each of the fingerprint recognition electrodes 43 has a size of 50-80 μm.

Figure 4:
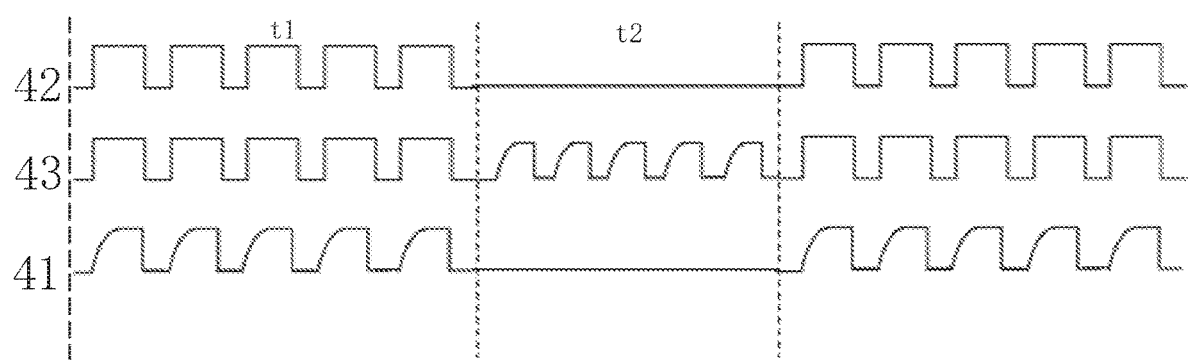
FIG. 4 is a drive timing diagram of a touch display device of the present invention.

Particularly, please refer to FIG. 4. Working processes of the touch display device include a touch phase t1 and a fingerprint recognition phase t2. In the touch phase t1, the driver module 3 provides a touch driving pulse to the second touch electrodes 42 and the fingerprint recognition electrodes 43, so that the first touch electrodes 41 are charged by the touch driving pulse to fulfill touch detection. In the fingerprint recognition phase t2, the driver module 3 is configured to control the first touch electrodes 41 and the second touch electrodes 42 to be grounded, and to provide a fingerprint recognition pulse to the fingerprint recognition electrodes 43 for fingerprint recognition.

As shown in FIG. 4, the touch driving pulse and the fingerprint recognition pulse have different periods and amplitudes.

Accordingly, the present invention provides a touch display device including a display panel and a touch recognition module. The touch recognition module includes a first electrode layer disposed on the display panel, an insulating layer disposed on both the first electrode layer and the display panel, and a second electrode layer disposed on the insulating layer. The first electrode layer includes a plurality of first touch electrodes spaced apart from each other, and the second electrode layer includes a touch area and a fingerprint recognition area adjacent to the touch area. The touch area includes a plurality of second touch electrodes spaced apart from each other, and the fingerprint recognition area includes a plurality of fingerprint recognition electrodes arranged in an array. During touch sensing, the first touch electrodes, the second touch electrodes, and the fingerprint recognition electrodes cooperatively form mutual capacitance for touch detection. During fingerprint recognition, the fingerprint recognition electrodes form self-capacitance for recognizing a fingerprint. In this manner, the present invention can reduce thickness of the touch display device and lower manufacturing costs, thereby to fulfill integration of fingerprint recognition under a screen and touch control and improve user experience.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A touch display device, comprising:
    a display panel and a touch recognition module; and
    a driver module;
    wherein the touch recognition module comprises a first electrode layer disposed on the display panel, an insulating layer disposed on both the first electrode layer and the display panel, and a second electrode layer disposed on the insulating layer;
    wherein the first electrode layer comprises a plurality of first touch electrodes spaced apart from each other and a first touch connecting line, and the second electrode layer comprises a touch area and a fingerprint recognition area adjacent to the touch area, a second touch connecting line, and a plurality of fingerprint connecting lines, wherein the touch area comprises a plurality of second touch electrodes spaced apart from each other, and the fingerprint recognition area comprises a plurality of fingerprint recognition electrodes arranged in an array, wherein the first touch electrodes are electrically connected to the driver module through the first touch connecting line, the second touch electrodes are electrically connected to the driver module through the second touch connecting line, and each of the fingerprint recognition electrodes is electrically connected to the driver module through one of the fingerprint connecting lines;
    wherein the first touch connecting line is electrically connected to the driving module after being changed to the second electrode layer through a via hole extending through the insulating layer; and
    wherein during touch sensing, the first touch electrodes, the second touch electrodes, and the fingerprint recognition electrodes cooperatively form mutual capacitance for touch detection, and during fingerprint recognition, the fingerprint recognition electrodes form self-capacitance for recognizing a fingerprint.

2. The touch display device of claim 1,
    wherein the driver module is configured to provide a touch driving pulse to the second touch electrodes and the fingerprint recognition electrodes during touch sensing, so that the first touch electrodes are charged by the touch driving pulse, and when recognizing a fingerprint, controlling the first touch electrodes and the second touch electrodes to be grounded, and providing a fingerprint recognition pulse to the fingerprint recognition electrodes.

3. The touch display device of claim 1, wherein the first touch electrodes in an extending direction are perpendicular to the second touch electrodes in an extending direction.

4. The touch display device of claim 1, wherein the touch area is concave in shape, and the fingerprint recognition area is defined by a concave portion of the touch area;
    wherein the touch area comprises a first sub-area and a second sub-area both disposed on left and right sides of the fingerprint recognition electrodes, respectively; and
    wherein the second electrode layer further comprises a plurality of connecting lines, one end of each of the connecting lines is electrically connected to one of the second touch electrodes in the first sub-area, and the other end bypasses the fingerprint recognition area to be electrically connected to one of the second touch electrodes in the second sub-area, wherein two of the second touch electrodes connected by the same connecting line are on a same straight line.

5. The touch display device of claim 1, wherein the display panel and the driver module are arranged sequentially in an extension direction of the first touch electrodes;
    wherein one end of the first touch connecting line is electrically connected to one end of each of the first touch electrodes away from the driver module, and the other end of the first touch connecting line is electrically connected to the driver module through a side of the display panel; and
    one end of the second touch connecting line is connected to one end of each of the second touch electrodes at another side of the display panel, and the other end of the second touch connecting line is electrically connected to the driver module.

6. The touch display device of claim 1, wherein the fingerprint connecting lines are each a metal mesh line or a transparent metal line.

7. The touch display device of claim 1, wherein the display panel is an organic light-emitting diode (OLED) display panel.

8. The touch display device of claim 7, wherein the display panel comprises a flexible substrate, a thin-film transistor (TFT) array disposed on the flexible substrate, an OLED layer disposed on the TFT array, and a thin-film encapsulation layer disposed on the OLED layer.

* * * * *